United States Patent [19]
Templin

[11] Patent Number: 5,352,331
[45] Date of Patent: Oct. 4, 1994

[54] CERMET ETCH TECHNIQUE FOR INTEGRATED CIRCUITS

[75] Inventor: Alan S. Templin, Hermosa Beach, Calif.

[73] Assignee: TRW Inc., Redondo Beach, Calif.

[21] Appl. No.: 163,260

[22] Filed: Dec. 7, 1993

[51] Int. Cl.$^5$ .............................................. B05D 5/00
[52] U.S. Cl. ...................... 156/656; 156/659.1; 156/667; 437/228; 252/79.3
[58] Field of Search ............ 156/656, 655, 667, 659.1; 437/228; 252/79.2, 79.3

[56] References Cited
U.S. PATENT DOCUMENTS 4,081,315 3/1978 Templin ........................ 156/656 X
5,152,869 10/1992 Ferraris et al. ................. 156/656 X Primary Examiner—Thi Dang

[57] ABSTRACT

An etching process for patterning thin film cermet (14) on a semiconductor substrate (10) using a mild, room temperature acid solution as the etchant. The semiconductor substrate (10) has a glass passivating layer (12), such as silicon dioxide, deposited thereon. The cermet layer (14) is deposited on the silicon dioxide layer (12). A photoresist layer (16) is deposited and patterned on the cermet layer (14) followed by the deposition of a layer of aluminum (18). The cermet (14) is then preferentially etched with a mild, room temperature hydrofluoric acid solution, diluted with hydrochloric acid, to form the desired cermet resistance pattern.

8 Claims, 1 Drawing Sheet

CERMET ETCH TECHNIQUE FOR INTEGRATED CIRCUITS

BACKGROUND OF THE INVENTION

The invention relates to a process for forming thin film cermet resistance patterns, and more particularly to such a process wherein the cermet is uniformly etched with good undercut control and minimal attack on the underlying substrate and the masking photoresist layer.

Cermet is a metal and ceramic material having a high resistance and low capacitance and which is easily trimmed by laser annealing. These characteristics make cermet an excellent thin film resistor material for GaAs integrated circuits. However, cermet is a difficult material to pattern in the extremely small geometries needed for large-scale integration. One reason for this is that chemicals which are natural etchants of cermet tend to also attack the masking photoresist layer and the underlying substrate at high rates.

U.S. Pat. No. 4,081,315 describes a particular cermet etching technique wherein a layer of molybdenum is used on the cermet layer to provide a good adherent for the photoresist layer which is deposited on the molybdenum layer. The exposed areas of the cermet are then etched with hot phosphoric acid at a temperature of around 180° C.

Although this technique produces excellent resolution without damaging the other parts of the circuit, further improvements have been made by way of this invention. This invention provides a process for etching cermet which provides these characteristics by using an aluminum layer deposited on the photoresist layer and the exposed areas of the cermet and etching the cermet with a mild solution of hydrofluoric acid. Moreover, the photoresist layer is deposited directly on the cermet eliminating the molybdenum layer.

SUMMARY OF THE INVENTION

The invention is embodied in a process of manufacturing or forming thin film cermet resistance patterns or elements on a substrate. The process comprises the steps of depositing a cermet layer on the substrate, depositing a masking material, such as a photoresist layer, on the cermet layer so as to expose selected areas of the cermet layer, depositing an aluminum layer on the photoresist layer and on the selected areas of the cermet layer, and etching away at least some of the aluminum layer and the cermet at the selected areas using an etchant comprising an acid solution. The acid solution is preferably hydrofluoric acid diluted to a mild concentration with hydrochloric acid. The mild hydrofluoric acid solution may be used at room temperature.

DESCRIPTION OF THE PREFERRED EMBODIMENT

Figure 1:
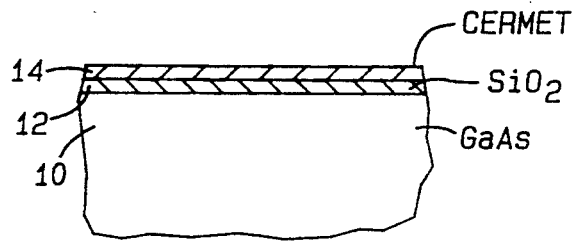
FIGS. 1, 2 and 4 are sectional views showing the initial steps of depositing various layers on a semiconductor substrate in accordance with the invention.

Referring now to the drawings in more detail, an improved process for depositing a layer of cermet material and forming the layer into a desired pattern on a substrate is illustrated. A glass passivating layer 12, such as $SiO_2$, is formed on a surface of a semiconductor substrate material 10, such as GaAs, in a known manner. A layer of cermet 14 is then deposited by known sputtering techniques onto the clean glass passivating layer 12 in the manner described in U.S. Pat. No. 4,081,315, the disclosure of which is incorporated by reference herein. FIG. 1 shows a GaAs substrate 10 covered with a layer of $SiO_2$ 12 which, in turn, has a layer of cermet 14 deposited thereon.

Figure 2:
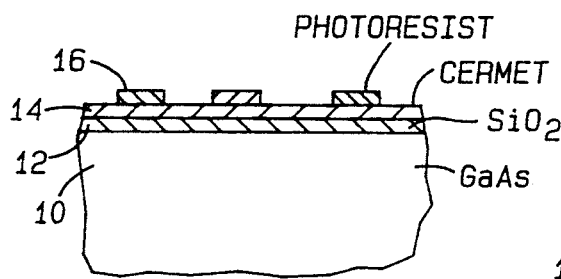
Figure 3:
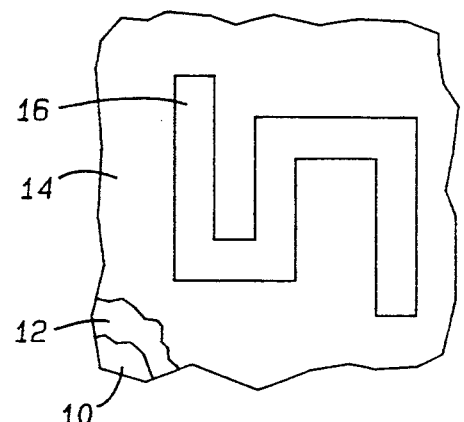
FIG. 3 is a plan view of FIG. 2.

A photoresist layer 16 which adheres well to metallic films is then applied on the freshly deposited cermet layer 14. The photoresist layer 16 is deposited and formed into a selected pattern on the cermet 14 using standard photolithographic techniques. The photoresist layer 16 is deposited so as to expose selected areas of the cermet layer 14. After the photoresist layer 16 is patterned, it is hardbaked. FIG. 2 shows in cross section the photoresist layer 16 hardbaked and patterned on the cermet layer 14. The patterned photoresist layer 16 is shown in plan view in FIG. 3.

Figure 4:
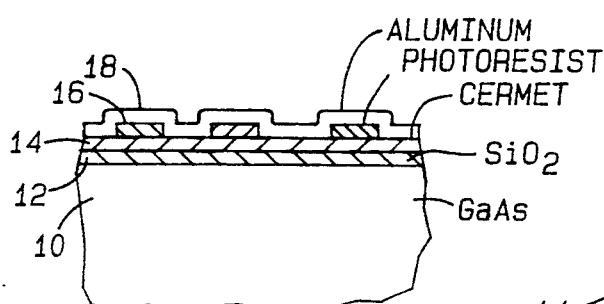

Next, a layer of aluminum 18 is deposited on the exposed surface of the cermet 14 and over the photoresist material 16, as shown in FIG. 4. The aluminum layer 18 on the cermet surface 14 acts as a reducer of SiO and $SiO_2$ bonds and forms $Al_2O_3$. Unlike SiO and $SiO_2$ which require concentrated hydrofluoric (HF) acid for etching to occur, $Al_2O_3$ can be etched with a mild HF acid solution. Thus, the addition of the aluminum layer 18 causes the breakdown of SiO and $SiO_2$ bonds and the formation of $Al_2O_3$ which allows the use of a mild solution of HF acid as the cermet etchant. The mild HF acid solution minimizes the attack on the underlying substrate 10.

The aluminum layer 18 on the hardbaked photoresist layer 16 also acts to temporarily deter the cermet etchant from attacking the photoresist layer 16. This allows adequate time for proper masking to take place with minimum undercut and lifting of the photoresist layer 16.

Figure 5:
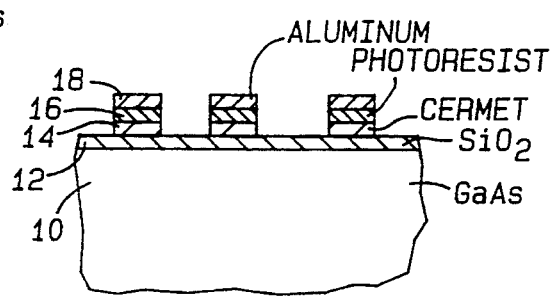
FIGS. 5 through 7 are sectional views showing the later steps of etching the layers to form a desired resistance pattern of cermet in accordance with the invention.

After the aluminum layer 18 is deposited, a mild HF acid solution, which may be at room temperature (i.e., 20 to 25° C.), is used in the next step of the process to remove the cermet 14 not protected by the photoresist layer 16. In this etching process, the aluminum layer 18, except that which is deposited on the photoresist layer 16, is usually removed as well. FIG. 5 shows the layers after the exposed cermet 14 and aluminum 18 not protected by the photoresist 16 are removed with the mild HF acid solution.

The mild HF acid solution for use as the cermet etchant should contain by volume between about 100 parts to about 400 parts hydrochloric acid (HCl) and 1 part HF acid and may be prepared by diluting concentrated HF acid solution with HCl.

Figure 6:
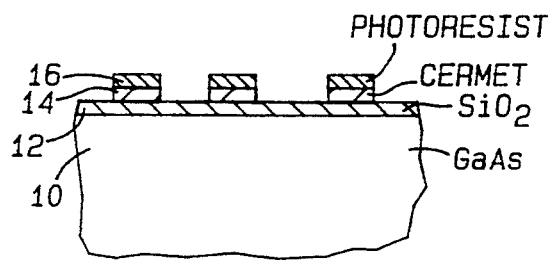
Figure 7:
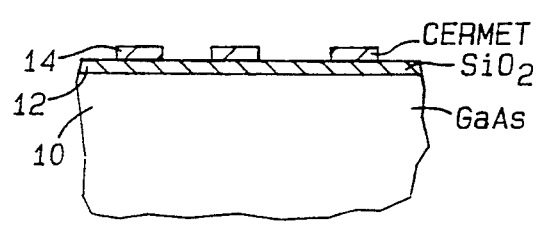

After the cermet 14 is preferentially etched, the residual aluminum 18 left on the photoresist material 16 is then stripped using an aluminum etchant to yield the layering shown in FIG. 6. The photoresist layer 16 may then be removed using a commercial stripper to leave only a sharply defined cermet pattern on the $SiO_2$ layer, as shown in FIG. 7.

The aforedescribed technique for forming thin film cermet resistance patterns on a semiconductor substrate is advantageous in that it allows the use of room temperature etchants. The technique also provides excellent geometry control during the etching process and easy batch processing.

Depending on the particular circuit, the cermet layer 14 may need to be subjected to further treatment such as laser trimming to give the cermet layer 14 a more precise resistance value. In the circuit, the cermet layer 14 will be connected at both ends to other microelectronic circuit components (not shown).

It should be readily apparent from the foregoing description that an embodiment of an improved process for uniformly etching cermet deposited on a substrate without damaging the underlying substrate and masking photoresist layer has been illustrated and described. Although an embodiment of the invention has been illustrated and described, various changes and modifications may be made without departing from the spirit and scope of the invention, as defined by the appended claims.

What is claimed is:

1. A process of manufacturing thin film cermet resistance patterns on a substrate comprising the steps of:
    depositing a cermet layer on said substrate,
    depositing a photoresist layer on said cermet layer so as to expose selected areas of said cermet layer,
    depositing an aluminum layer on said photoresist layer and on said selected areas of said cermet layer, and
    etching away at least some of said aluminum layer and the cermet at said selected areas using an etchant comprising an acid solution.

2. The process as recited in claim 1, wherein said acid solution comprises a mild hydrofluoric acid solution having a concentration from about 100:1 to about 400:1.

3. The process as recited in claim 2, wherein said acid solution further comprises hydrochloric acid.

4. The process as recited in claim 2, wherein said acid solution is at a temperature from about 20° C. to about 25° C.

5. A process of forming thin film cermet resistance elements on a substrate comprising the steps of:
    depositing a cermet layer on said substrate,
    depositing a masking material on said cermet layer so as to expose selected areas of said cermet layer,
    depositing an aluminum layer on said masking material and on said selected areas of said cermet layer, and
    subjecting said aluminum layer and the cermet at said selected areas to an acid solution for a sufficient time to chemically remove at least some of said aluminum layer and the cermet at said selected areas.

6. The process as recited in claim 5, wherein said acid solution comprises a mild hydrofluoric acid solution having a concentration from about 100:1 to about 400:1.

7. The process as recited in claim 6, wherein said acid solution further comprises hydrochloric acid.

8. The process as recited in claim 6, wherein said acid solution is at a temperature from about 20° C. to about 25° C.

* * * * *